United States Patent
Brunnbauer et al.

(10) Patent No.: US 10,466,782 B2
(45) Date of Patent: Nov. 5, 2019

(54) ARTICLE OF CLOTHING WITH A GLOVE AND AN ELECTRIC OPERATIONAL ELEMENT AND METHOD OF MANUFACTURING AN ARTICLE OF CLOTHING WITH A GLOVE AND AN ELECTRIC OPERATIONAL ELEMENT

(71) Applicants: Konstantin Brunnbauer, Ruderting (DE); Hans Christian Sittig, Freiburg (DE); Paul Guenther, Bad Teinach (DE)

(72) Inventors: Konstantin Brunnbauer, Ruderting (DE); Hans Christian Sittig, Freiburg (DE); Paul Guenther, Bad Teinach (DE)

(73) Assignee: WORKAROUND GMBH (DE)

( * ) Notice: Subject to any disclaimer, the term of this patent is extended or adjusted under 35 U.S.C. 154(b) by 0 days.

(21) Appl. No.: 15/594,698

(22) Filed: May 15, 2017

(65) Prior Publication Data
US 2018/0299954 A1 Oct. 18, 2018

(30) Foreign Application Priority Data
May 18, 2016 (DE) .................. 10 2016 109 113

(51) Int. Cl.
| G06F 3/01 | (2006.01) |
| A41D 19/00 | (2006.01) |
| H03K 17/96 | (2006.01) |
| A41D 1/00 | (2018.01) |

(52) U.S. Cl.
CPC ............ *G06F 3/014* (2013.01); *A41D 1/005* (2013.01); *A41D 19/0024* (2013.01);
(Continued)

(58) Field of Classification Search
CPC ............ A41D 19/0024; A41D 19/0027; A41D 1/005; G06F 3/014; G06F 3/017; H03K 17/962; H03K 17/9625
See application file for complete search history.

(56) References Cited

U.S. PATENT DOCUMENTS

| 7,307,242 B1 * | 12/2007 | Chen ................ A41D 19/01535 219/211 |
| 2002/0163495 A1 * | 11/2002 | Doynov .................. G06F 3/014 345/156 |

(Continued)

FOREIGN PATENT DOCUMENTS

| CN | 2109745 | 7/1992 |
| GB | 2422527 | 8/2006 |
| JP | 2011094246 | 5/2011 |

OTHER PUBLICATIONS

British search report dated Aug. 17, 2017.
English summary of office action in German counterpart application.

*Primary Examiner* — Viet D Pham
(74) *Attorney, Agent, or Firm* — Carlson, Gaskey & Olds, P.C.

(57) ABSTRACT

An article of clothing comprises a glove, at least one electric operational element attached to the glove, an electrical contact point for the electric operational element, and at least one cable that electrically connects the electric operational element to the electrical contact point. The cable is attached to the glove and runs mainly in at least one neutral region of the glove in a neutral direction with respect to a change in length upon a movement of a hand or of a finger. Further, a method of manufacturing such an article of clothing is shown.

23 Claims, 9 Drawing Sheets

(52) U.S. Cl.
CPC ......... *A41D 19/0027* (2013.01); *G06F 3/017* (2013.01); *H03K 17/962* (2013.01); *H03K 17/9625* (2013.01)

(56) References Cited

U.S. PATENT DOCUMENTS

| | | | |
|---|---|---|---|
| 2002/0194668 A1 | 12/2002 | Kwon | |
| 2003/0006962 A1* | 1/2003 | Bajramovic | G06F 3/014 345/158 |
| 2003/0026170 A1* | 2/2003 | Yang | G04C 3/005 368/10 |
| 2006/0033710 A1* | 2/2006 | Bajramovic | G06F 1/163 345/156 |
| 2008/0262666 A1* | 10/2008 | Manning | A63C 17/12 701/21 |
| 2009/0056107 A1* | 3/2009 | Williams | H05B 3/342 29/610.1 |
| 2009/0057289 A1* | 3/2009 | Williams | A41D 19/01535 219/211 |
| 2009/0057290 A1* | 3/2009 | Williams | H05B 3/342 219/211 |
| 2010/0156783 A1* | 6/2010 | Bajramovic | G06F 1/163 345/156 |
| 2011/0016609 A1* | 1/2011 | Phelps | A41D 19/0024 2/162 |
| 2011/0078842 A1* | 4/2011 | Tang | A41D 19/0157 2/160 |
| 2013/0258644 A1* | 10/2013 | Comunale | A41D 19/0157 362/103 |
| 2016/0068214 A1 | 3/2016 | Tang et al. | |

\* cited by examiner

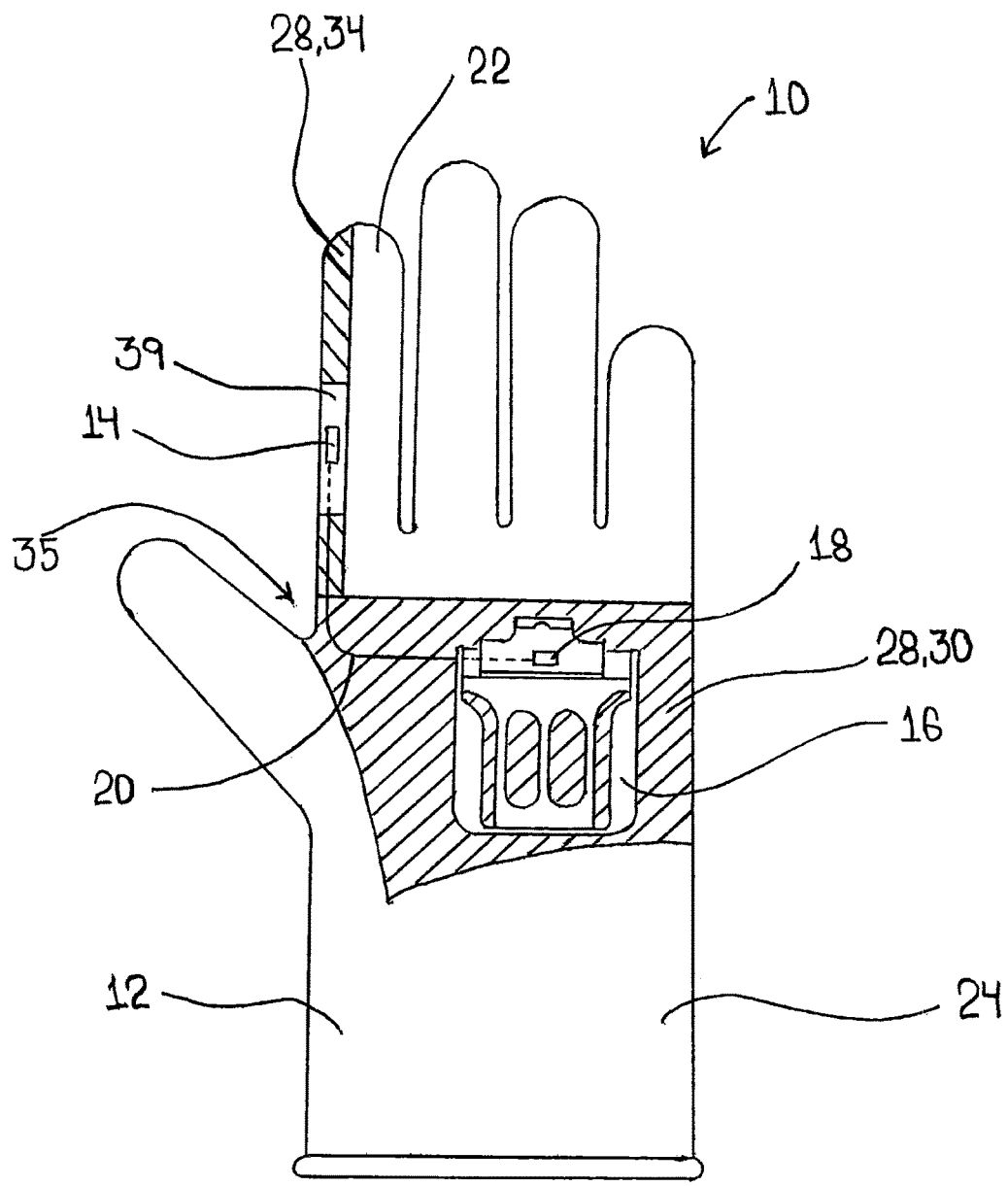

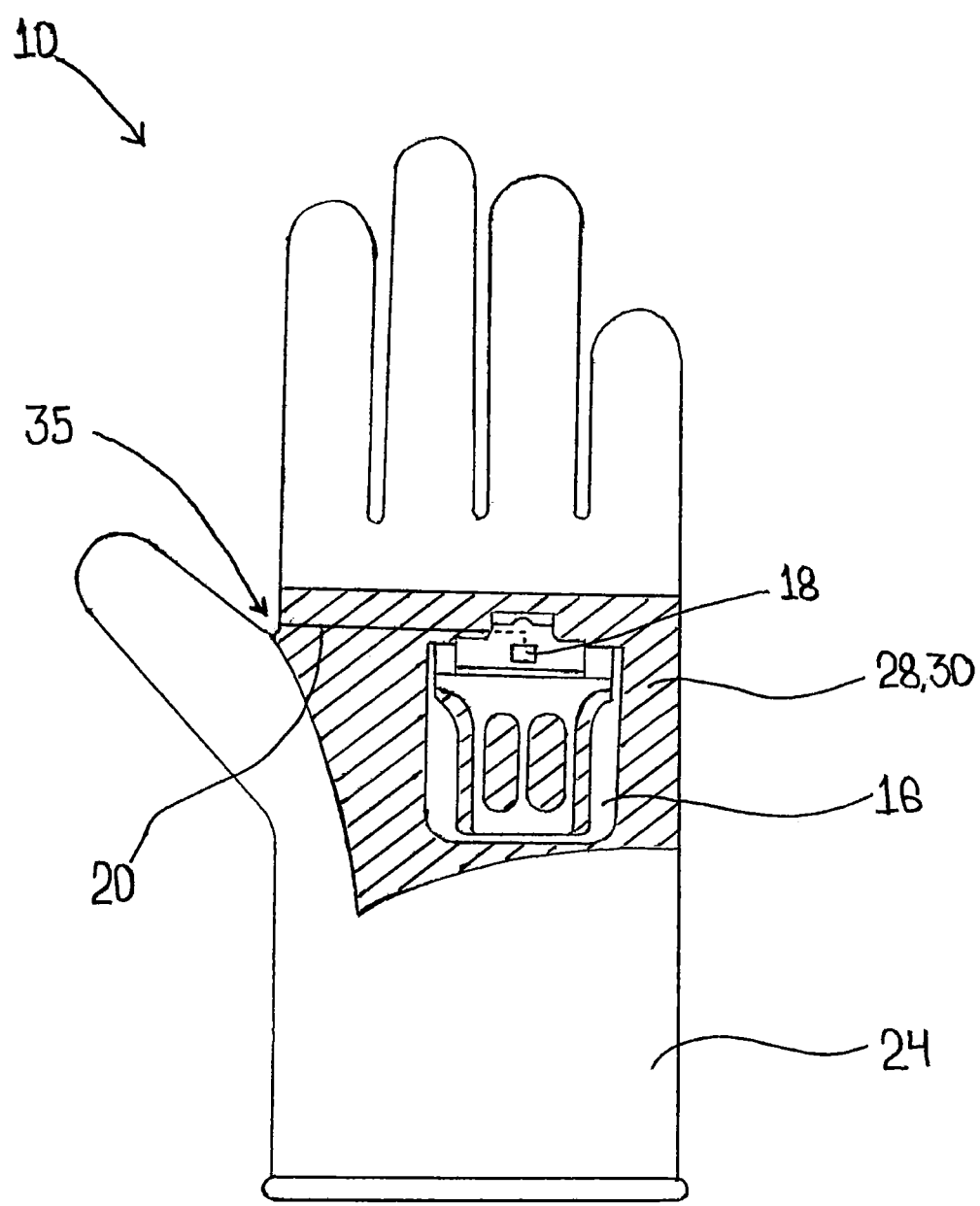

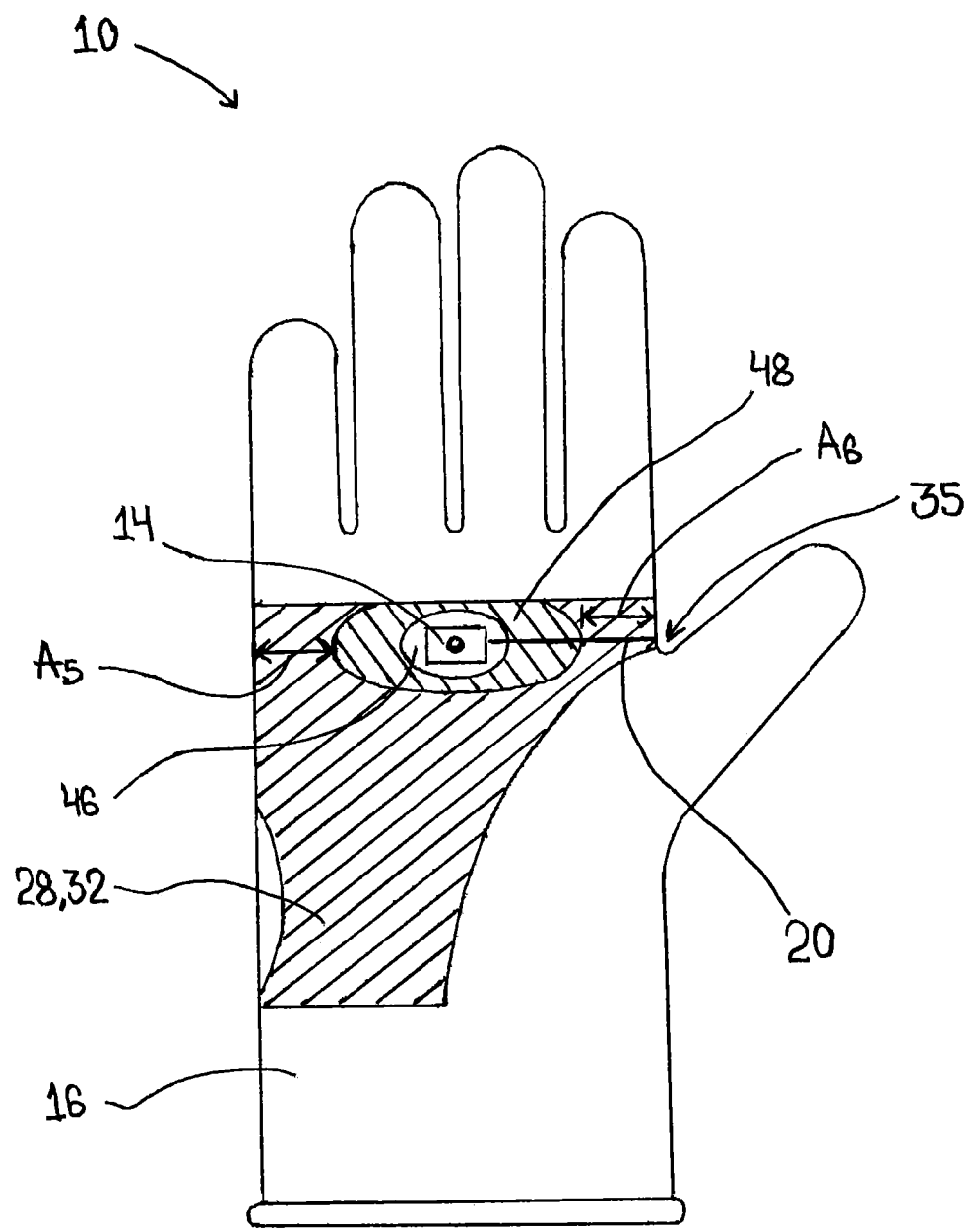

ARTICLE OF CLOTHING WITH A GLOVE AND AN ELECTRIC OPERATIONAL ELEMENT AND METHOD OF MANUFACTURING AN ARTICLE OF CLOTHING WITH A GLOVE AND AN ELECTRIC OPERATIONAL ELEMENT

CROSS-REFERENCE TO RELATED APPLICATIONS

This application claims priority to DE 10 2016 109 113.8, filed May 18, 2016.

FIELD OF THE INVENTION

The present invention relates to an article of clothing comprising a glove and an electric operational element as well as to a method of manufacturing an article of clothing comprising a glove and an electric operational element.

BACKGROUND

Articles of clothing comprising electric operational elements are known. To connect an electric operational element to a circuit, cables are sewn into, or attached to, the article of clothing.

In this connection, problems occur due to the fact that, as a rule, the materials of the article of clothing are elastic and extensible, whereas conventional electrical cables are inelastic and non-extensible. As a result, the cables will soon break in normal use of the articles of clothing, which is why elastic cables are typically used; however, elastic cables are expensive and require more space.

In particular in the case of gloves, these problems occur to an increased extent since when the fingers are moved, the material of the glove is subjected to a heavy tensile stress, which entails a great increase in length. In the process, the cables attached to the glove are also subjected to tensile stress, leading to fracture of the cables.

Also, the differences in the elasticities of the glove and the cable may lead to constrictions of the user's hand, detracting from the wearing comfort of the glove.

It is therefore the object of the invention to provide an article of clothing having a glove and an electric operational element attached to the glove, as well as a method of manufacturing it, the article of clothing being cost-effective to manufacture and having a long service life.

SUMMARY

The object is achieved by an article of clothing, in particular an article of work clothing, including a glove which has an internal side that faces the hand when the glove is being worn and an external side. An electric operational element is attached to the glove, and an electrical contact point integrates the electric operational element into a circuit. At least one cable electrically connects the electric operational element to the electrical contact point. The cable is attached to the glove and runs mainly, in particular entirely, in at least one neutral region of the glove in a neutral direction of the at least one neutral region with respect to a change in length upon a movement of the hand or of a finger.

Those regions of the glove whose length does not, or only insignificantly, increase in a direction, referred to as neutral direction, upon a movement of the fingers or of the hand when the glove is used as usual and as intended are considered to be neutral regions of the glove. Neutral regions are located, for example, at the side faces of the fingers along the neutral fiber of the fingers with respect to a flexure of the fingers with a neutral direction parallel to the finger, at the dorsum of the hand proximal to the metacarpophalangeal joints, and at the corresponding areas of the ball of the hand in the direction transversely to the fingers, referred to as the transverse direction of the hand here.

The invention is based on the finding that damage to the cable can be avoided even without the use of expensive elastic cables by arranging a simple cable in regions of the glove that do not experience any change in length in the direction in which the cable runs. For the purposes of the present invention, these regions are referred to as "neutral regions", and the direction in which no change in length occurs is referred to as "neutral direction". For this reason, arranging the cables in neutral regions along the neutral direction results in that the cables will not be subjected to tensile loading and will therefore have a long service life, while at the same time they are cost-effective to produce.

For the purposes of the present invention, a cable is understood to mean not only a conventional metal cable, but also other conductive structures such as a flexible printed circuit board or a foil with conductor tracks printed thereon. Just like a conventional cable, a flexible printed circuit board and a foil with conductor tracks printed thereon are also not able to withstand tensile stress, i.e. are not extensible, since the conductor tracks applied thereon will easily rupture when subjected to tensile stress.

To illustrate the neutral regions, human hands 1 are shown in FIGS. 1a, 1b, 2a and 2b. Dashed lines and hatched areas indicate neutral regions 2 on the hands 1.

These neutral regions 2 may be divided into neutral fibers 4 on the fingers of the hands 1 and neutral areas 6, 8 on the dorsum and the palm of the hands 1.

The neutral fiber 4 runs in the middle of the side faces of the fingers and along the fingertips, as is apparent from FIGS. 1 and 2. When the fingers are bent, the skin along these neutral fibers is neither substantially stretched nor compressed in the direction parallel to the fingers, so that the length of the skin along the neutral fibers does not change.

The same applies to the neutral area 6 on the dorsum of the hand, which roughly extends proximally, i.e. towards the wrist, from the metacarpophalangeal joints, and the neutral area 8 on the palm of the hand, which extends proximally from the balls of the fingers. Here, no substantial change in length occurs in the transverse direction of the hand.

That is, within the neutral areas 6, 8, the skin does not experience a change in length as measured in the transverse direction of the hand, whereas the skin does not experience a change in length in the direction of the fingers in the neutral fibers 4.

Similar to the skin, a glove worn on a hand is also subjected to stretching and compression upon movements of the fingers or of the entire hand.

Correspondingly, regions on a glove can also be determined in which the material of the glove is neither compressed nor stretched when the fingers and/or the hand is/are moved.

These regions of a glove are substantially those portions of a glove that rest against the neutral regions 2 of a hand 1 when the glove is being worn.

For the purposes of the present invention, apart from a full glove having fingers, a glove is understood to mean other pieces of handwear as well, such as a finger stall or a finger cot. Further, the glove may be configured in multiple parts. The glove according to the invention may be in the form of a finger stall, a finger cot, or else in multiple parts here. For example, the glove is an elastic and snugly fitting work glove, which, in addition, has to meet occupational safety requirements. For a further extension of the service life of the glove, the glove may be provided with a reinforcement layer at its external side in the region of the operational element. It is also conceivable that the contact point is a cable end.

Preferably, the cable is configured to be inelastic in its longitudinal direction. The material of the cable is thus neither stretchable nor elastic in the longitudinal direction, nor is the cable configured to be extensible based on its arrangement (e.g., a spiral arrangement or in a zigzag). In this way, the cable is cost-effective and simple to attach.

For example, the glove includes at least one finger part that receives a finger of the user, the electric operational element being provided on the finger part. The finger part does not need to cover the entire finger. A half finger or a ring is sufficient, which may also be configured separately from the rest of the glove. Arranging the electric operational element on the finger part allows a simple operation of the electric operational element to be achieved.

In one variant embodiment, the glove includes at least one palm section, the electric operational element being provided on the palm section. Arranging the electric operational element in the region of the palm provides a better protection of the electric operational element from any unintentional damage. Here, the electric operational element may be preferably provided in a special region within the palm section, this region proceeding from the side edge of the little finger, i.e. the edge of the hand, in the transverse direction of the hand roughly at a distance that corresponds to the width of the little finger, and extending up to a distance from the end of the palm section on the thumb side, which roughly corresponds to the width of the index finger, and this region extending in the longitudinal direction of the hand between the crook of the thumb and the end of the second neutral area on the fingertip side. The widths of the fingers relate to the widths at the bases of the fingers. This allows the electric operational element to be operated very simply with one hand.

Preferably, the glove includes a section corresponding to the dorsum of the hand, the electrical contact point being provided at the section corresponding to the dorsum of the hand, so that the electrical contact point is easily accessible.

In one embodiment of the invention, the cable, in particular over the entire length thereof, and/or the electric operational element is/are bonded, in particular heat bonded, to the glove. In this way, a simple and cost-effective attachment of the cable and the electric operational element to the glove can be realized, which at the same time also contributes to the strain relief of the cable.

Preferably, the article of clothing includes a strip of material, in particular a strip of textile material, the cable and/or the electric operational element being arranged between the strip of material and the glove. The strip of material may also be heat bonded to the glove here. From the outside inward, the article of clothing in these regions then first includes the glove, then the cable or the operational element, then the adhesive and, as the innermost layer, the strip of material, the adhesive surrounding the cable and providing a strain relief for the cable and/or the electric operational element. In case a reinforcement layer is provided, it forms the outermost layer. The strip of material protects the cable or the electric operational element from damage.

In one variant embodiment of the invention, the electrical contact point is arranged at one of the sides of the glove, in particular the external side, and the electric operational element is arranged at the other side of the glove, in particular the internal side, and/or the cable runs largely at the internal side, the cable passing through an aperture of the glove. In this way, the electric operational element and the cable can be fitted to be protected, whereas the electrical contact point is simple to reach.

In a further development of the invention, the glove includes a retainer for a removable electronics module, the electrical contact point being arranged at the retainer and being configured such that the electrical contact point can connect the electronics module to the electric operational element in terms of signaling, which provides for a simple and reliable connection of the electric operational element to an exchangeable electronics module. The electronics module here may be a control unit of the operational element, a reading device, or a barcode scanner.

For example, the electrical contact point includes a mechanical contact and/or an antenna of a wireless communication interface, so that the signal-related connection is reliably ensured. The mechanical contact may include contact pins here which, for example, are configured to be resilient.

In one configuration of the invention, the electric operational element includes a touch sensor, a pressure sensor, a button, a switch, a capacitive and/or inductive sensor surface, a reading device, and/or an LED, as a result of which the electric operational element may perform a multitude of functions.

The object of the invention is further achieved by a method of manufacturing an article of clothing, comprising the steps of:
  (a) providing a glove;
  (b) placing a cable at a neutral region in the neutral direction of this neutral region of the glove; and
  (c) attaching the cable to the glove by heat bonding.

The method allows a long-lasting article of clothing including an electric operational element to be manufactured simply and cost-effectively.

Preferably, the cable is covered with a strip of material prior to the heat bonding. The hot-melt adhesive may already be provided at the strip of material here. In this way, a particularly durable connection between the cable and the glove is ensured.

For example, prior to the bonding, the cable and/or the strip of material is/are provisionally fixed to the glove using an adhesive, so that the assembly is simplified. The adhesive may be selected here such that it will vaporize during heating.

In one configuration of the invention, the glove is turned inside out prior to placing the cable, so that the internal side of the glove faces outwards, the cable and/or the electric operational element being attached to the internal side of the glove, as a result of which a simple and wear-resistant attachment of the cable and/or of the electric operational element to the glove is made possible.

Preferably, a tool is provided in which the electrical contact point, the retainer, and/or the electric operational element are arranged, the glove turned inside out then being pulled over the tool, so that the electrical contact point, the retainer, and/or the electric operational element are attached at the external side of the glove, the cable being electrically connected to the electrical contact point, the retainer, and/or the electric operational element through the glove prior to applying the hot-melt adhesive and/or the strip of material.

In the process, the cable is passed through the glove and the cable is attached, e.g., by soldering. Furthermore, the tool may have contact pressure surfaces for the strip of material. This allows a standardized manufacture of the article of clothing that exhibits little susceptibility to error.

In one further configuration of the invention, heat is supplied, in particular by a heated stamp, for bonding of the internal side of the glove at which the cable is arranged, wherein both the hot-melt adhesive at the cable and the hot-melt adhesive at the electrical contact point, at the retainer, and/or at the electric operational element melts and attaches the cable as well as the contact point, the retainer and/or the operational element to the glove. The heat is preferably supplied only from one side here. In this way, it is possible to attach elements to the glove on both sides of the glove in only one heating step with a one-sided application of heat.

Furthermore, a reinforcement layer may also be arranged on the tool and may be attached just like the retainer. As a result, the attachment of the reinforcement layer does also not require a further heating step.

These and other features may be best understood from the following drawings and specification.

BRIEF DESCRIPTION OF THE DRAWINGS

Further features and advantages of the invention will be apparent from the description below and from the accompanying drawings, to which reference is made and in which:

FIG. 3 schematically shows an article of clothing according to a first embodiment of the invention in a non-worn condition in a top view of a dorsum of the hand;

FIG. 4a schematically shows a top view of the dorsum of the glove of the article of clothing of FIG. 3 in the non-worn condition, with neutral regions drawn in;

FIG. 4b schematically shows a top view of the palm of the glove of the article of clothing of FIG. 3 in the non-worn condition, with neutral regions drawn in;

FIG. 4c schematically shows a side view of a finger part of the glove of the article of clothing of FIG. 3 in the worn condition, with a neutral region drawn in;

FIG. 8 schematically shows an article of clothing according to a second embodiment of the invention in a non-worn condition in a top view of the dorsum of the hand; and FIG. 9 shows the article of clothing according to FIG. 8 in the non-worn condition in a top view of the palm of the hand.

DETAILED DESCRIPTION

Figure 1A:
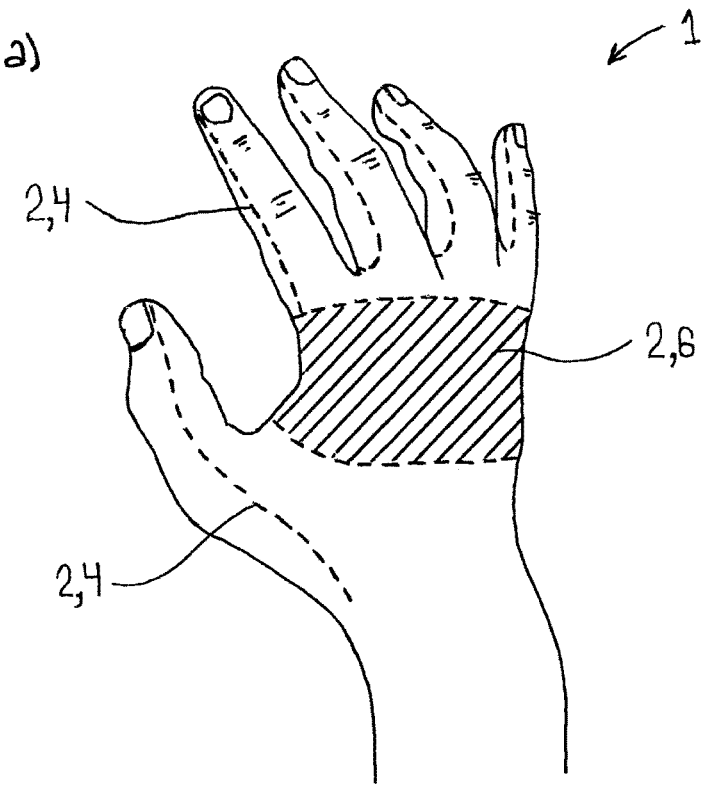
FIGS. 1a and 1b schematically show a top view of a dorsum of a human right hand.
Figure 1B:
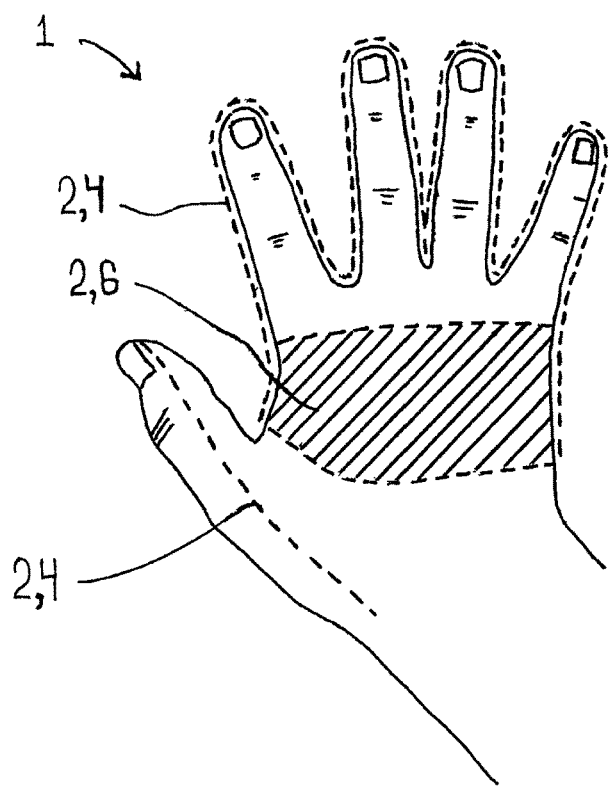
Figure 2:
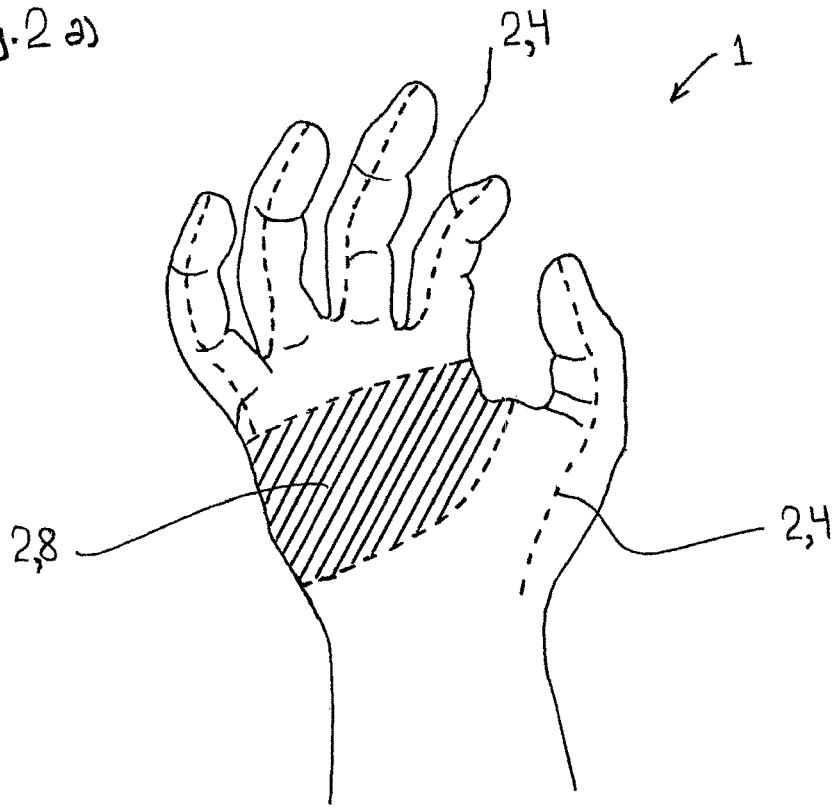
FIGS. 2a and 2b show a top view of a palm of a human right hand.
Figure 2:
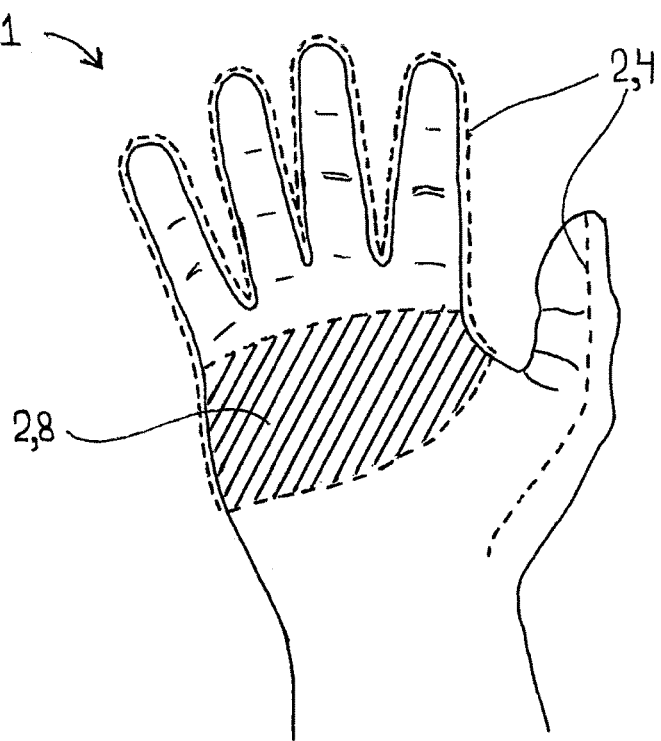

FIG. 3 illustrates an article of clothing 10 including a glove 12, an electric operational element 14, a retainer 16 having a contact point 18, and a cable 20 according to a first embodiment of the invention.

In the embodiment shown, the glove 12 is a full glove having five finger parts 22, each for receiving one finger of a user, a section 24 corresponding to a dorsum of a hand, which in the worn condition rests against the dorsum of the hand of the user, and a palm section 26 (cf. FIG. 8), which is associated with the palm of the hand of the user.

The glove may be produced from nylon and coated with polyurethane and/or nitrile. A glove made from cotton is also conceivable.

Of course, the glove 12 does not need to be a full glove, but may also be in the form of a finger cot, a finger stall, or in several parts.

Figure 4A:
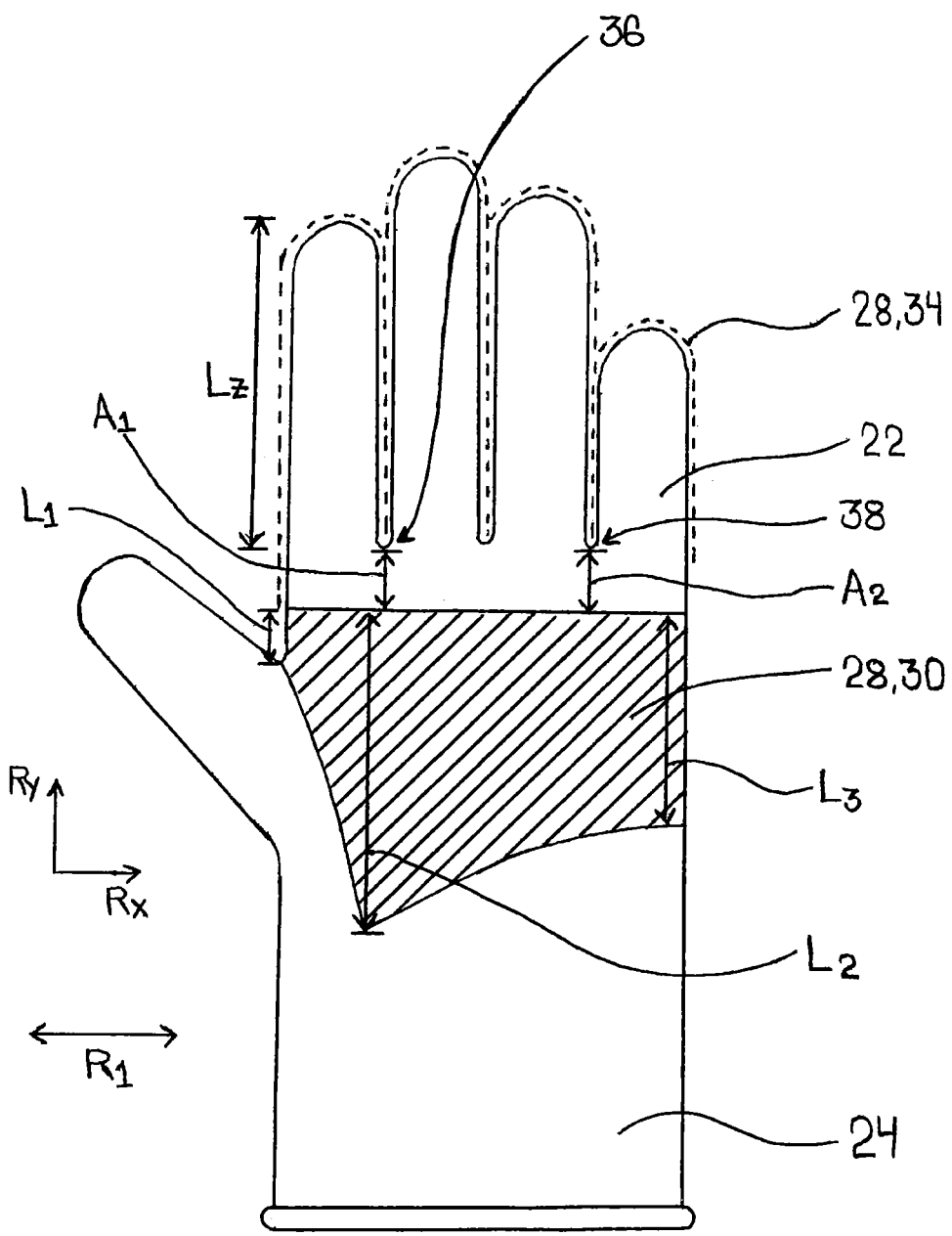
Figure 4B:
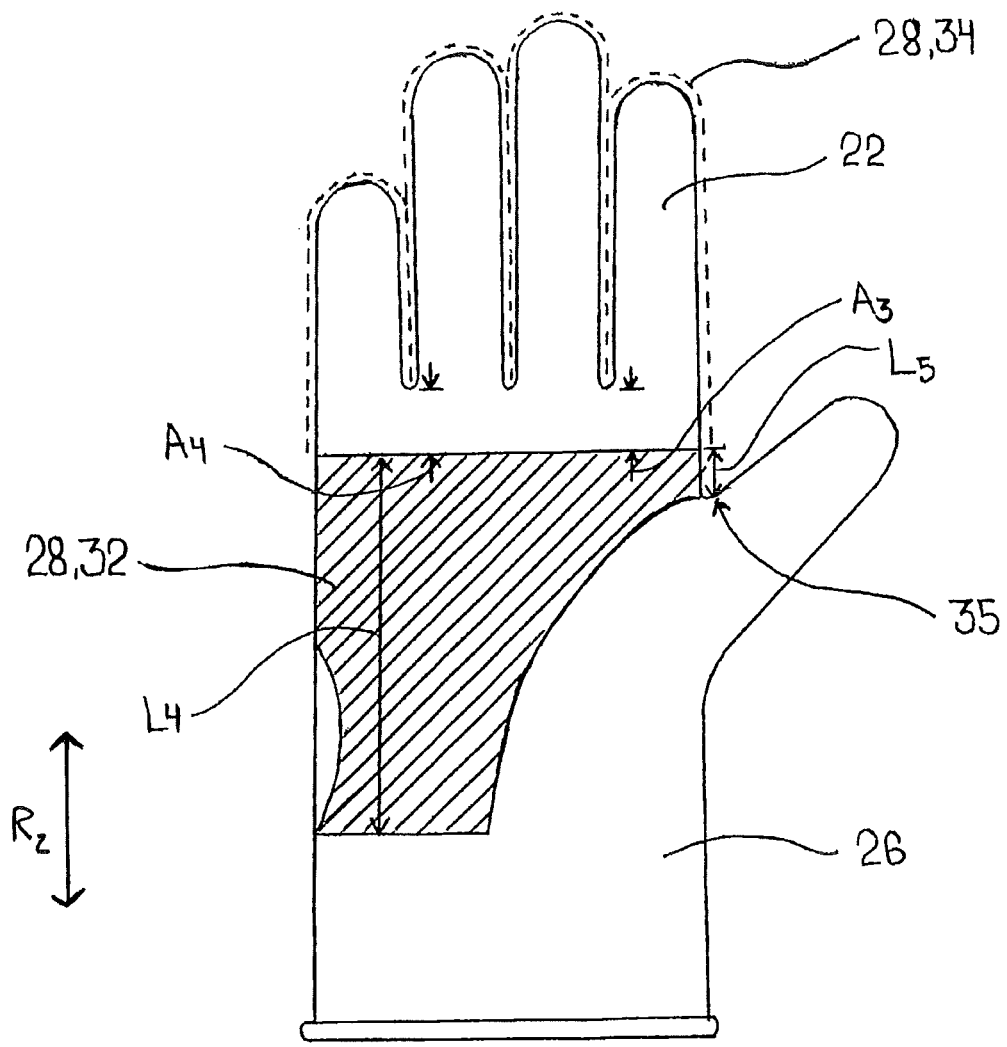

The glove 12 has neutral regions 28, which are illustrated in dashed lines and as hatched areas in FIGS. 4a and 4b. For reasons of clarity, the electric operational element 14, the retainer 16, the contact point 18, and the cable 20 are not illustrated in FIGS. 4a and 4b.

In the following, the glove 12 will be described with the aid of the anatomical terms of a hand; what is meant here is the respective portion of the glove that rests on the cited location of the hand when the glove 12 is worn as intended. For example, for simplification, only the metacarpophalangeal joint of the index finger is referred to when that portion of the glove 12 is meant which in the worn condition rests on the metacarpophalangeal joint of the index finger.

The neutral regions 28 include a first neutral area 30 on the section 24 corresponding to the dorsum of the hand on the dorsum of the hand, a second neutral area 32 on the palm section 26 on the palm of the hand, and neutral finger areas 34 on the finger parts 22.

The first neutral area 30 extends on the side of the dorsum facing the thumb, i.e. on the left side in FIG. 4a, from the wrist to the portion in contact with the metacarpophalangeal joint of the index finger.

On the side of the little finger, i.e. on the right side of FIG. 4a, the first neutral area 30 extends from the side of the metacarpophalangeal joint, facing the wrist, of the little finger toward the wrist, but over four fifths of the length of the first neutral area 30 on the thumb side.

The neutral direction $R_1$ of the first neutral area 30 runs in the transverse direction $R_x$ of the hand.

The second neutral area 32 on the palm section 26 extends on the side of the little finger, i.e. on the left side in FIG. 4b, from the wrist to the finger ball of the little finger on the wrist side. In the region of the finger balls of the index, middle, ring, and little fingers, the second neutral area 32 extends over the entire width of the palm section 26.

On the thumb side, i.e. on the right side in FIG. 4b, the second neutral area only extends from below the finger ball at the index finger to the crook of the thumb.

The boundary of the neutral area 32 here extends from the crook of the thumb 35 along the ball of the thumb as far as to the beginning of the wrist to a point located approximately in the center of the wrist in the transverse direction $R_x$ of the hand.

The neutral direction $R_2$ of the second neutral area 32 runs in the transverse direction $R_x$ of the hand.

Figure 4C:
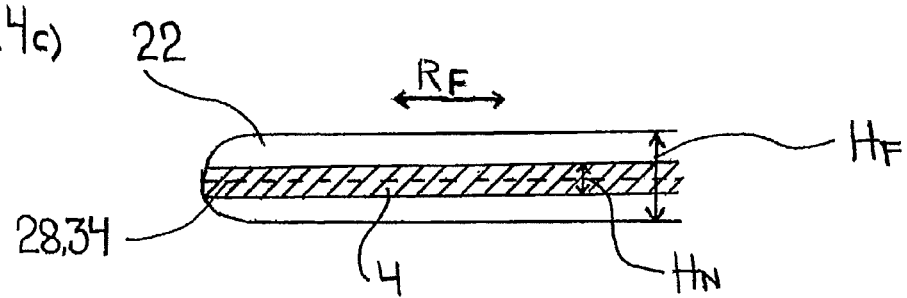

The neutral finger areas 34 are indicated in FIG. 4c, in which one of the finger parts 22 is illustrated. The neutral fiber 4 of the finger is indicated as a dashed line, and the neutral finger area 34 extends in the longitudinal direction parallel to the neutral fiber 4. The height $H_N$ of the neutral finger area 34 roughly corresponds to one third of the height $H_F$ of the finger. The neutral finger area 34 thus runs in the middle third of the side face of the finger along the entire finger.

The neutral direction $R_F$ of the neutral finger areas 34 runs in the longitudinal direction $R_y$ (FIG. 4a) of the finger.

With regard to the length $L_z$ of the index finger of the glove 12, or, in the case of a finger stall or finger cot having the theoretical length of the index finger, the first neutral area 30 begins on the section 24 corresponding to the dorsum of the hand approximately at a distance $A_1$ from the base of the index finger 36, which corresponds to about 40% of the length $L_z$ of the index finger, and at a distance $A_2$ from the base of the little finger 38, which corresponds to about 20% of the length $L_z$ of the index finger. The length $L_1$ of the neutral area 30 on the side of the hand to the crook of the thumb 35 amounts to about 20% of the length $L_z$ of the index finger.

The length $L_2$ of the neutral area 30 between the index finger and the wrist, however, already corresponds to roughly the length $L_z$ of the index finger.

The length $L_3$ of the neutral area 30 on the side of the little finger amounts to roughly 80% of the length $L_z$ of the index finger.

The neutral area 30 therefore roughly describes an irregular pentagon on the section 24 corresponding to the dorsum of the hand.

The second neutral area 32 can also be determined with the aid of the length $L_z$ of the index finger.

The second neutral area 32 begins at a distance $A_3$ and $A_4$ from the base of the index finger 36 and from the base of the little finger 38, respectively, which corresponds to about half the length $L_z$ of the index finger.

The length $L_4$ on the side of the little finger of the second neutral area 32 amounts to approximately half the length $L_z$ of the index finger. The length $L_4$ of the second neutral area 32 remains the same up to roughly the level of the middle of the wrist. From there, the length of the second neutral area 32 decreases until it reaches the length $L_5$ between the thumb and the index finger, corresponding to about 20% of the length $L_z$ of the index finger.

In this region, the first neutral area 30 and the second neutral area 32 transition into each other.

When moving the hand or the fingers of the hand, the glove 12 will be neither compressed nor stretched within the first neutral area 30 and the second neutral area 32 in the transverse direction $R_x$ of the hand, so that their lengths remain approximately constant in the transverse direction $R_x$ of the hand.

The length of the glove does not change in the longitudinal direction $R_y$ of the finger within the neutral finger areas 34, i.e. it will neither be compressed nor stretched in the longitudinal direction of the hand.

As can be seen in FIG. 3, the electric operational element 14 is arranged within the neutral finger area 34 of the finger part 22 of the index finger.

In this region, the glove 12 may be provided with a reinforcement layer 39 on its external side in order to obviate any wear in this region of the glove 12 when the operational element 14 is frequently touched.

In the embodiment shown, the operational element 14 is a pushbutton. But the operational element 14 may, of course, also be, or additionally include, some other electrical component such as a pressure sensor, a touch sensor, a switch, a capacitive and/or inductive sensor surface, a reading device, and/or an LED.

The retainer 16 is arranged within the first neutral area 30 on the section 24 corresponding to the dorsum of the hand and is provided with a contact point 18, and can receive an electronics module and thus attach the electronics module to the glove 12.

The contact point 18 is electrically connected to the electric operational element 14 with the cable 20 so that a signal-related connection between a circuit of an electronics module inserted in the retainer 16 and the operational element 14 can be produced via the contact point 18.

The contact point 18 may be formed as a mechanical contact point having mechanical contacts. The contacts may be spring contacts, which are made to be resilient with respect to the retainer 16.

It is also conceivable that the contact point 18 is in the form of a wireless communication interface, for example an antenna.

The cable 20 is designed to be inelastic and is, for example, a commercially available copper cable.

Neither is the material of the cable 20 stretchable, nor is the cable 20 arranged in such a way as to be stretchable, as would be the case with a spiral or a zigzag arrangement.

In the embodiment shown, the cable 20 runs from the contact point 18 at first within the first neutral area 30 along the transverse direction $R_x$ of the hand to the thumb side of the dorsum section 24. That is, the cable 20 thus runs along the neutral direction $R_1$ of the first neutral area 30.

In the region of the index finger, the cable 20 then extends within the neutral finger area 34 of the index finger in the longitudinal direction $R_y$ of the finger up to the electric operational element 14. So the cable 20 therefore runs along the neutral direction $R_F$ of the neutral finger area 34.

In the embodiment shown, the cable 20 thus runs entirely within a neutral area 28, so that the cable 20 is protected from damage in the best possible way.

This ensures that the cable 20 is exposed to no or only low tensile forces which might lead to cable ruptures.

In the embodiment shown, both the cable 20 and the electric operational element 14 are attached on the internal side of the glove 12, i.e. the side facing the hand when the glove 12 is being worn.

Attachment of the cable 20 is effected, for example, using a hot-melt adhesive 40 over the entire length of the cable 20. The hot-melt adhesive may be EVA or TPU, for example.

Thus, the cable 20 runs entirely on the inside.

Figure 5:
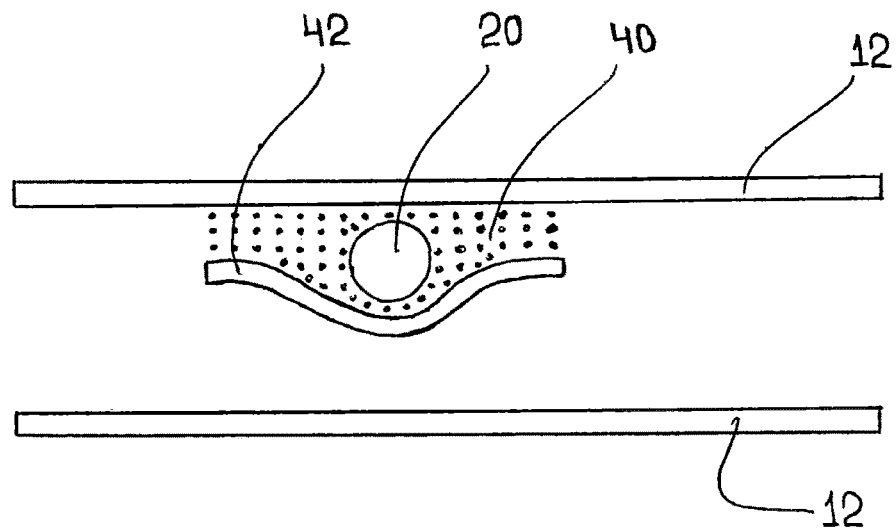
FIG. 5 schematically shows a sectional view of a cable routing region of the glove of FIG. 3 in a section taken perpendicularly to the cable.

As is illustrated (not to scale) in FIG. 5, the cable 20 is additionally covered by a strip of material 42, so that the cable 20 is arranged in the hot-melt adhesive 40 between the strip of material 42 and the glove 12. The strip of material 42 is a strip of textile material, for example. This provides a further strain relief for the cable 20.

Figure 6:
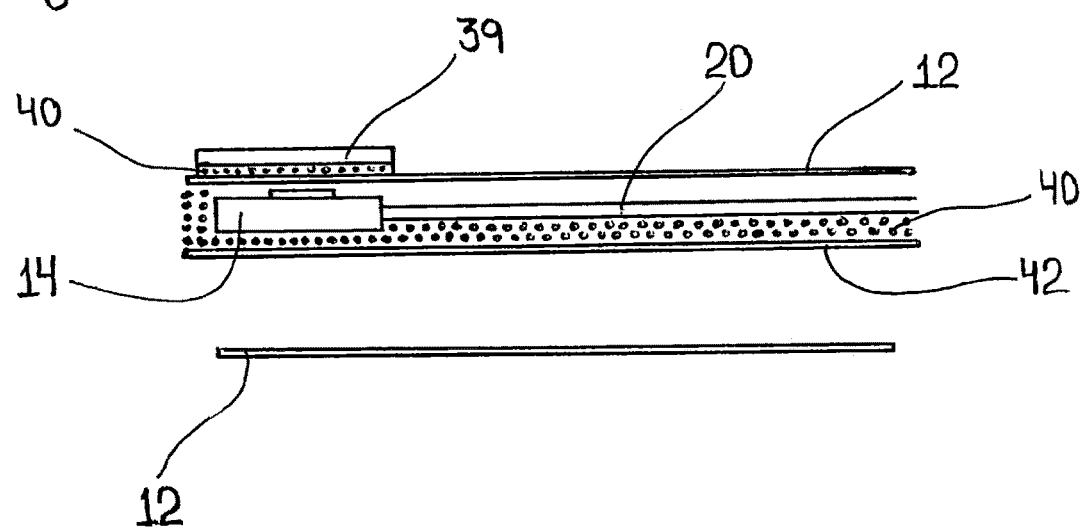
FIG. 6 schematically shows a longitudinal section of the index finger of the glove shown in FIG. 3.

The operational element 14 is also attached to the internal side of the glove 12 using the hot-melt adhesive 40 and is covered by the strip of material 42, as is illustrated in FIG. 6. The reinforcement layer 39 is also shown in FIG. 6.

Figure 7:
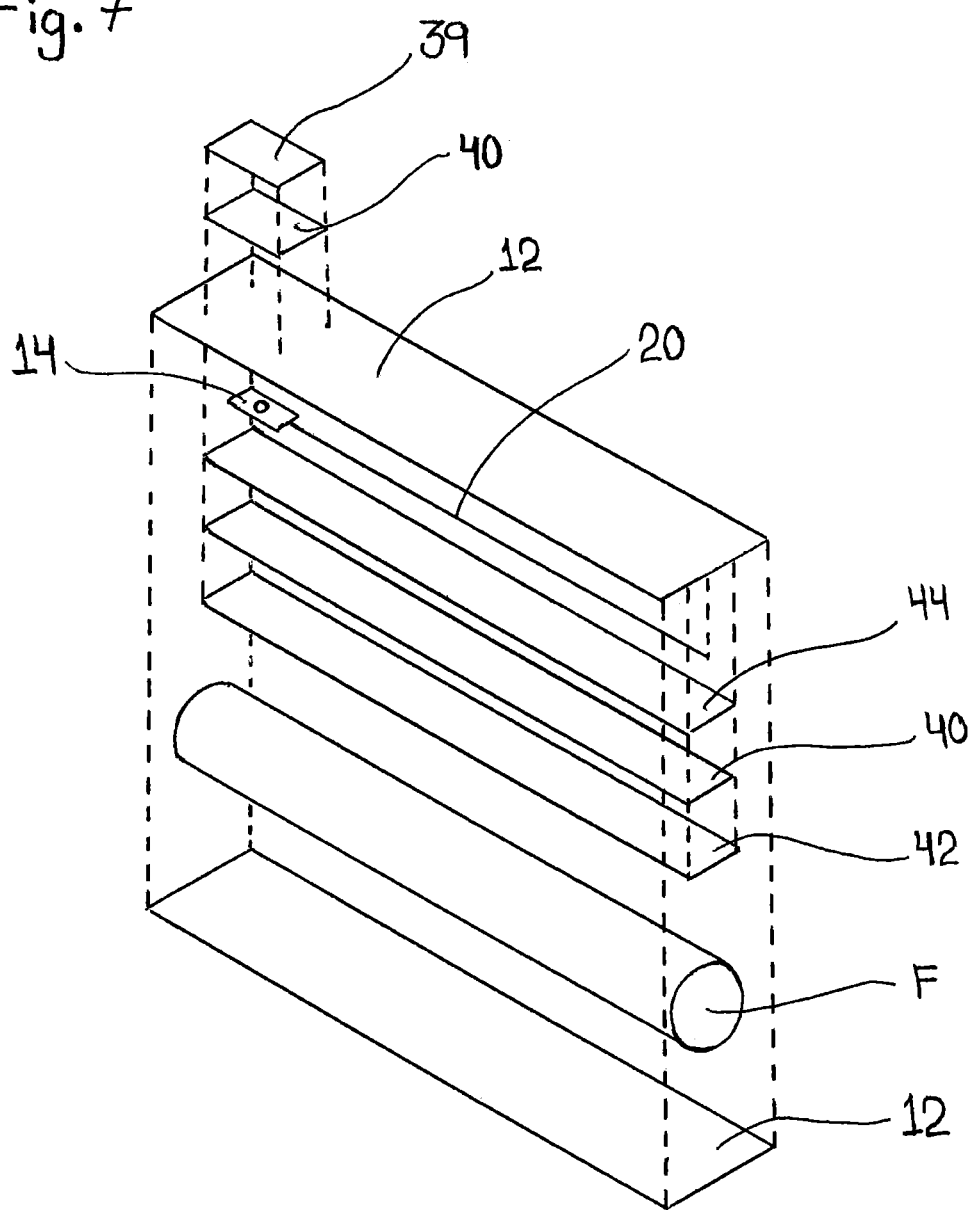
FIG. 7 shows an exploded view of the portion illustrated in FIG. 6.

This results in a layer structure as is apparent from FIG. 7. The finger F of the user is inserted in the glove 12. In the region of the cable 20 and the operational element 14, the finger comes into contact with the strip of material 42, which covers a layer of hot-melt adhesive 40. The electric operational element 14 and the cable 20 are embedded in the layer of hot-melt adhesive 40 and attached to the glove 12.

A reinforcement layer 39 is attached on the external side of the glove 12 in the region of the operational element 14, likewise by a hot-melt adhesive 40.

A layer of adhesive 44 used for simplifying the assembly may be provided between the hot-melt adhesive 40 and the cable 20 or the electric operational element 14.

To manufacture the article of clothing 10, first a tool (not shown) is provided. The tool may be formed roughly in the shape of a hand. The retainer 16 along with the contact point 18 as well as the reinforcement layer 39 may be arranged on the tool in dedicated sections. In addition, the tool may have contact pressure surfaces for the strip of material 42.

In the next step, the glove 12 is provided. The glove 12 may be a work glove as is used, for example, by workmen on assembly lines in industry. The glove 12 thus is a consumable item.

The glove 12 is now turned inside out, so that the internal side of the glove 12 is facing outwards.

The glove 12, turned inside out, is then pulled onto the tool, so that the retainer 16 with the contact point 18 and the reinforcement layer 39 rest against the external side of the glove 12 at those locations at which they are to be attached.

The glove 12 is then provided with an aperture in the region of the contact point 18, for example with the aid of a soldering iron. The heat of the soldering iron causes the edge of the aperture to fuse, so that it cannot tear.

Then the cable 20, to which the electric operational element 14 may already have been attached, is arranged in the neutral regions 28 of the glove 12 along the neutral directions $R_1$, $R_F$ as described above.

After that, the cable 20 may be connected to the contact point 18, for example by soldering, so that an electrical connection is produced between the electric operational element 14 and the contact point 18.

For simpler handling, the cable may be preliminarily fixed to the glove 12 with an adhesive 44.

Subsequently, the cable 20 and the electric operational element 14 are covered with the strip of material 42, the hot-melt adhesive 40 already being provided on the strip of material 42.

The strip of material 42 may also be preliminarily fixed to the glove 12 by an adhesive 44.

If required, some hot-melt adhesive 40 is also placed in, or in the region of, the aperture, to provide a sufficient amount of hot-melt adhesive 40 for attaching the retainer 16.

A heated stamp is then pressed onto the internal side, prepared in this way, of the glove 12, so that heat is supplied to the glove 12 from one side. In the process, the strip of material 42 can also be pressed against the glove 12 by the contact pressure surfaces, to ensure a safe bonding of the strip of material 42.

This causes the hot-melt adhesive 40 to melt at the contact point 18, at the retainer 16, at the electric operational element 14, and at the cable 20. In the course of this, the hot-melt adhesive 40 passes through the glove 12, so that the retainer 16 and the contact point 18 need not be separately provided with hot-melt adhesive 40 before the glove 12 is pulled on the tool.

After the hot-melt adhesive 40 has melted, the stamp is removed so that the hot-melt adhesive 40 can cool down.

The hot-melt adhesive 40 sets while cooling down, connecting the individual elements of the article of clothing 10 permanently with each other.

The adhesive 44 that was applied for provisionally fixing the cable 20 and/or the strip of material 42 vaporizes during the heating process.

In this way, the cable 20 and the electric operational element 14 are attached on the internal side of the glove 12, whereas the retainer 16 with the contact point 18 is attached on the external side of the glove 12. This is done in one single heating step.

The reinforcement layer 39 is also attached to the external side of the glove 12 in this way.

An electronics module (not shown) can now be exchangeably inserted into the retainer 16 and is connected to the operational element 14 by the contact point 18 and the cable 20 for signal-related purposes, so that the operational element 14 is integrated in the circuit of the electronics module.

FIGS. 8 and 9 illustrate a second embodiment of the article of clothing 10. It substantially corresponds to the first embodiment, so that only the differences will be discussed below. Identical and functionally identical parts are provided with the same reference numbers.

In the second embodiment according to FIGS. 8 and 9, however, the electric operational element 14 is not provided on the finger part 22, but within the second neutral area 32 on the palm section 26.

The cable 20 therefore extends only in the transverse direction $R_x$ of the hand within the first neutral area 30 and the second neutral area 32, that is, in the neutral directions $R_1$, $R_2$.

In the embodiment according to FIGS. 8 and 9 as shown, the cable 20 runs over the thumb side of the hand, but it is also conceivable that it runs over the side of the little finger.

The electric operational element 14 is in the form of a pushbutton in this embodiment as well. However, in order that the pushbutton is not unintentionally actuated, a bead 46 that is made from an elastic material is provided around the pushbutton.

In the case of a surface load on the palm section 26, the bead 46 takes up the load without the switch of the operational element 14 being tripped.

In this embodiment, the operational element 14 is arranged within the second neutral area 32 in a region 48 that is easy for the user to reach.

This region 48 corresponds to that area of the palm section 26 where the tips of the middle finger and the ring finger of the user or the corresponding portions of the glove 12 touch the palm section 26 when the user clenches his/her hand into a fist.

In the transverse direction of the hand, the region 48 proceeds from the side of the little finger, i.e. in FIG. 9 from the left end of the palm section 26 or from the edge of the hand, roughly at a distance $A_5$ that corresponds to the width of the little finger, and extends up to a distance $A_6$ from the thumb side of the palm section 26, i.e. in FIG. 9 from the right end of the palm section 26 that roughly corresponds to the width of the index finger. In the longitudinal direction of the hand, the region 48 extends between the crook of the thumb 35 and the end of the second neutral area 32 on the fingertip side.

It is, of course, also conceivable that a plurality of operational elements 14 is provided at different locations of the article of clothing 10.

Although an embodiment of this invention has been disclosed, a worker of ordinary skill in this art would recognize that certain modifications would come within the scope of this disclosure. For that reason, the following claims should be studied to determine the true scope and content of this disclosure.

The invention claimed is:

1. An article of clothing comprising:
   a glove which has an internal side that faces a hand when said glove is being worn and an external side;
   at least one electric operational element that is attached to said glove;
   at least one electrical contact point for integrating said at least one electric operational element into a circuit; and
   at least one cable that electrically connects said at least one electric operational element to said at least one electrical contact point, wherein said at least one cable is attached to said glove and runs mainly in at least one neutral region of said glove in a neutral direction of said at least one neutral region with respect to a change in length upon a movement of said hand or of a finger, and wherein the at least one neutral region comprises a region of the glove whose length does not substantially change in the neutral direction in response to the movement of said hand or of a finger, and wherein said at least one cable is configured to be inelastic in a longitudinal direction.

2. The article of clothing according to claim 1, wherein said at least one cable runs entirely in the at least one neutral region of said glove in the neutral direction of said at least one neutral region with respect to a change in length upon movement of said hand or finger.

3. The article of clothing according to claim 1, wherein said glove includes at least one finger part to receive a finger of a user, said at least one electric operational element being provided on said at least one finger part.

4. The article of clothing according to claim 1, wherein said glove includes at least one palm section, said at least one electric operational element being provided on said at least one palm section.

5. The article of clothing according to claim 1, wherein said glove includes a section corresponding to a dorsum of the hand, said at least one electrical contact point being provided at said section corresponding to the dorsum of the hand.

6. The article of clothing according to claim 1, wherein at least one of said at least one cable and said at least one electric operational element is bonded to said glove.

7. The article of clothing according to claim 6, wherein at least one of said at least one cable and said at least one electric operational element is heat bonded to said glove.

8. The article of clothing according to claim 1, including a strip of material, wherein at least one of said at least one cable and said at least one electric operational element is arranged between said strip of material and said glove.

9. The article of clothing according to claim 1, wherein said at least one electrical contact point is arranged at one side of said glove and said at least one electric operational element is arranged at another side of said glove, and said at least one cable runs largely at said internal side.

10. The article of clothing according to claim 9, wherein said at least one electrical contact point is arranged at the external side of said glove and said at least one electric operational element is arranged at the internal side of said glove.

11. The article of clothing according to claim 1, wherein said glove includes a retainer for a removable electronics module, said at least one electrical contact point being arranged at said retainer and being configured such that at least one electrical contact point can connect said removable electronics module to said at least one electric operational element in terms of signaling.

12. The article of clothing according to claim 1, wherein said at least one electrical contact point includes at least one of a mechanical contact and an antenna of a wireless communication interface.

13. The article of clothing according to claim 1, wherein said at least one electric operational element includes at least one of a touch sensor, a pressure sensor, a button, a switch, a capacitive sensor surface, an inductive sensor surface, a capacitive-inductive sensor surface, a reading device, and an LED.

14. The article of clothing according to claim 1, wherein the neutral direction comprises a direction in which no substantial change in length of the glove occurs.

15. A method of manufacturing an article of clothing, comprising the steps of:

(a) providing a glove;
(b) placing a cable at a neutral region in a neutral direction of said neutral region of said glove, said cable being configured to be inelastic in a longitudinal direction, and wherein the at least one neutral region comprises a region of the glove whose length does not substantially change in the neutral direction in response to a movement of a hand or of a finger; and
(c) attaching said cable to said glove by heat bonding.

16. The method according to claim 15, including covering said cable with a strip of material prior to said heat bonding.

17. The method according to claim 16, including, prior to bonding, provisionally fixing at least one of said cable and said strip of material to said glove using an adhesive.

18. The method according to claim 15, including, prior to placing said cable, turning said glove inside out so that an internal side of said glove faces outwards, and attaching at least one of said cable and at least one electric operational element to said internal side of said glove.

19. The method according to claim 18, including providing a tool in which at least one of an electrical contact point, a retainer, and an electric operational element is arranged, said glove turned inside out then being pulled over said tool so that at least one of said electrical contact point, said retainer, and said electric operational element is attached to said external side of said glove, said cable being electrically connected to at least one of said electrical contact point, said retainer, and said electric operational element through said glove prior to applying at least one of a hot-melt adhesive and a strip of material.

20. The method according to claim 19, wherein heat is supplied for bonding of said internal side of said glove at which said cable is arranged, wherein both said hot-melt adhesive at said cable and said hot-melt adhesive at the at least one of said electrical contact point, said retainer and said electric operational element melts and attaches said cable as well as at least one of said electrical contact point, said retainer, and said electric operational element to said glove.

21. The method according to claim 15, wherein the neutral direction comprises a direction in which no substantial change in length of the glove occurs.

22. The method according to claim 15, wherein step (b) further includes arranging the cable in the neutral region such that the cable runs in the neutral direction.

23. An article of clothing comprising:
a glove which has an internal side that faces a hand when said glove is being worn and an external side;
at least one electric operational element that is attached to said glove;
at least one electrical contact point for integrating said at least one electric operational element into a circuit; and
at least one cable that electrically connects said at least one electric operational element to said at least one electrical contact point, wherein said at least one cable is attached to said glove and runs mainly in at least one neutral region of said glove in a neutral direction of said at least one neutral region with respect to a change in length upon a movement of said hand or of a finger, and wherein the at least one neutral region comprises a region of the glove whose length does not substantially change in the neutral direction in response to the movement of said hand or of a finger, and wherein the at least one neutral region extends in a longitudinal direction along at least one finger of the glove.

* * * * *